(12) United States Patent
Harada et al.

(10) Patent No.: US 10,147,791 B2
(45) Date of Patent: Dec. 4, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yuichi Harada, Matsumoto (JP); Yasuyuki Hoshi, Matsumoto (JP); Akimasa Kinoshita, Matsumoto (JP); Yasuhiko Oonishi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/283,999

(22) Filed: Oct. 3, 2016

(65) Prior Publication Data

US 2017/0025503 A1    Jan. 26, 2017

Related U.S. Application Data

(63) Continuation of application No. PCT/JP2015/072910, filed on Aug. 13, 2015.

(30) Foreign Application Priority Data

Sep. 8, 2014   (JP) ................................ 2014-182768

(51) Int. Cl.
*H01L 29/78* (2006.01)
*H01L 29/16* (2006.01)
(Continued)

(52) U.S. Cl.
CPC ........ *H01L 29/1608* (2013.01); *H01L 21/266* (2013.01); *H01L 21/26513* (2013.01); *H01L 29/66068* (2013.01); *H01L 29/78* (2013.01)

(58) Field of Classification Search
None
See application file for complete search history.

(56) References Cited

U.S. PATENT DOCUMENTS 5,057,884 A    10/1991   Suzuki et al.
2008/0121993 A1*  5/2008   Hefner ................ H01L 21/0465
                                                  257/341
(Continued)

FOREIGN PATENT DOCUMENTS

JP    H01-255276 A    10/1989
JP    H06-338616 A    12/1994
(Continued)

*Primary Examiner* — Charles D Garber
*Assistant Examiner* — Xiaoming Liu
(74) *Attorney, Agent, or Firm* — Rabin & Berdo, P.C.

(57) ABSTRACT

A semiconductor device includes an $n^+$-type source region having an impurity concentration higher than that of an n-type source region, formed in a surface layer of a p-type SiC layer and a p-type base region, farther on an outer side than the n-type source region, and contacting the n-type source region; an n-type region and an $n^+$-type region having an impurity concentration higher than that of the $n^-$-type SiC layer, formed in a portion of the $n^-$-type SiC layer between p-type base regions and p-type SiC layers; and a second n-type region under the p-type base region and of a size smaller than that of the p-type base region, whereby low on-resistance and precision of the threshold voltage Vth are enhanced, increasing quality and enabling improved resistance to dielectric breakdown of the gate insulating film and resistance to breakdown.

8 Claims, 7 Drawing Sheets

(51) Int. Cl.
*H01L 21/265* (2006.01)
*H01L 21/266* (2006.01)
*H01L 29/66* (2006.01)

(56) References Cited

U.S. PATENT DOCUMENTS

2014/0070230 A1* 3/2014 O'Loughlin ........ H01L 29/1608
257/77
2014/0210008 A1 7/2014 Oritsuki et al.

FOREIGN PATENT DOCUMENTS

JP H08-186254 A 7/1996
JP 2014-146738 A 8/2014

* cited by examiner

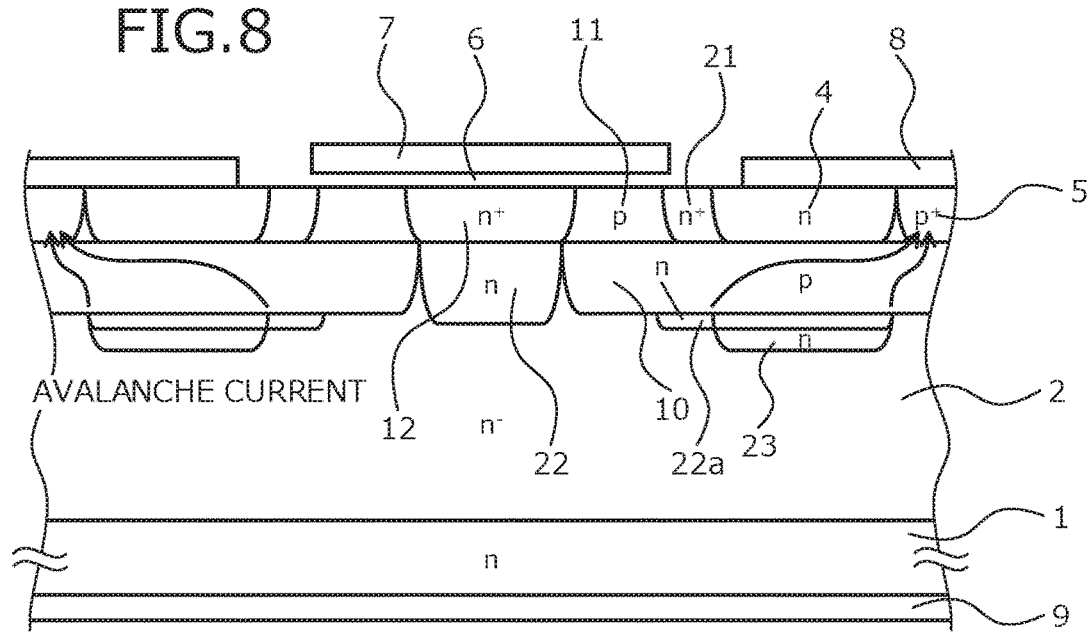
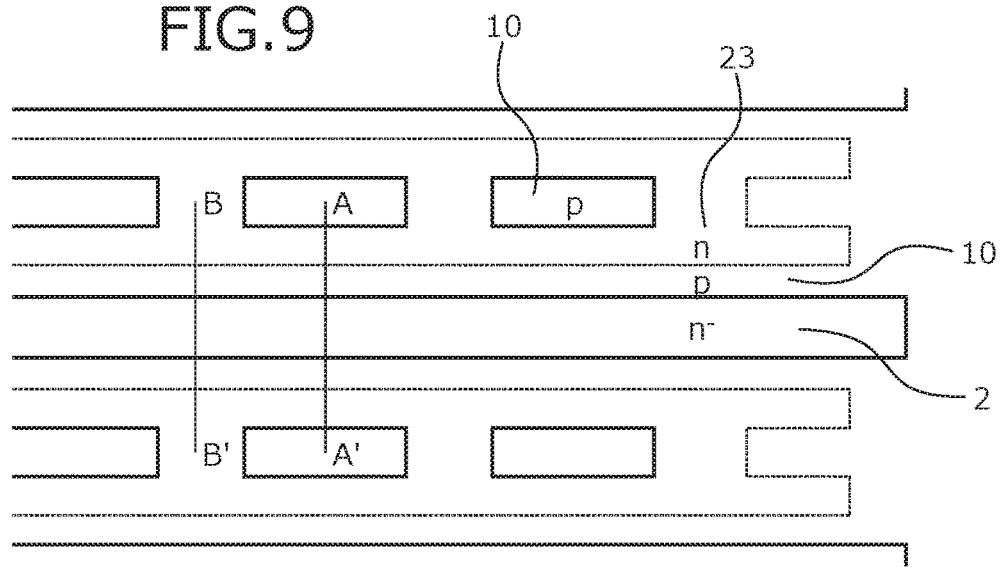

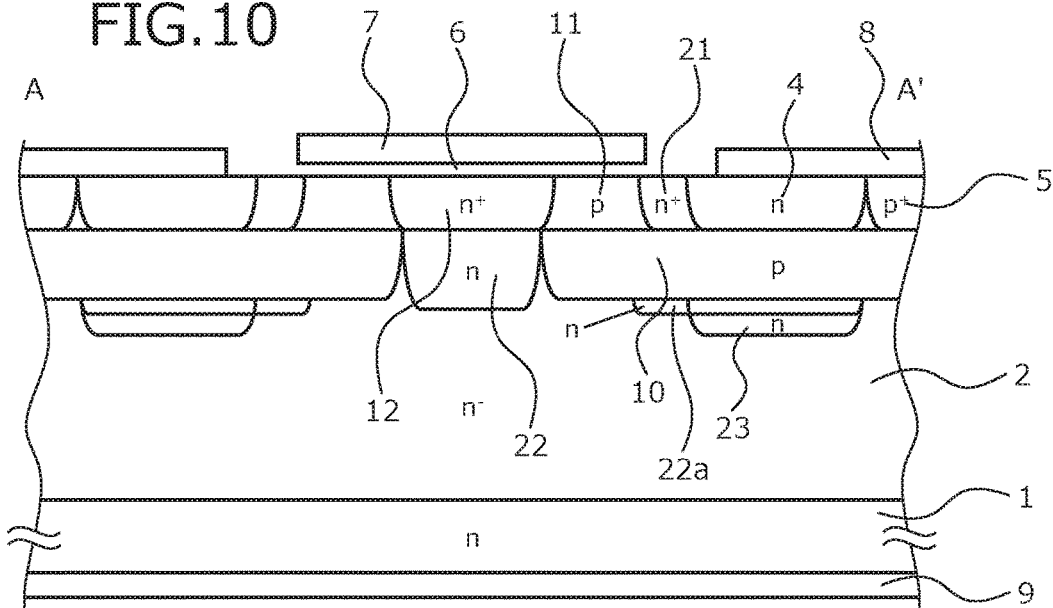
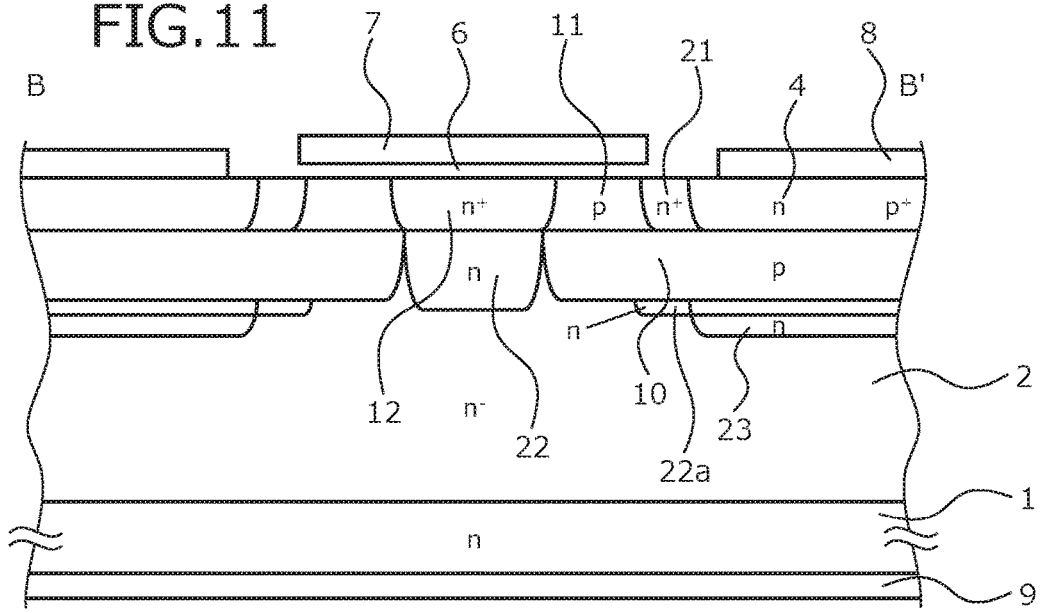

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/072910 filed on Aug. 13, 2015 which claims priority from a Japanese Patent Application No. 2004-182768 filed on Sep. 8, 2014, the contents of which are incorporated herein by reference.

BACKGROUND OF THE INVENTION

1. Field of the Invention

The embodiments discussed herein relate to a semiconductor device and method of manufacturing a semiconductor device used as a switching device formed on a silicon carbide substrate.

2. Description of the Related Art

FIG. 19 is a cross-sectional view of a conventional n-channel MOSFET formed using a silicon carbide substrate. An $n^-$-type SiC layer 2 having a low impurity concentration is formed on a front surface side of an n-type silicon carbide (SiC) substrate 1 and p-type base regions 10 are formed in a surface layer of the $n^-$-type SiC layer 2. P-type SiC layers 11 are further formed on the surface of the p-type base regions 10. On the front surface of the $n^-$-type SiC layer 2 where no p-type base region 10 is formed, an n-type region 12 is formed between the p-type SiC layers 11. A $p^+$-type contact region 5 of a high impurity concentration and an n-type source region 4 are formed in the p-type SiC layers 11. A source electrode 8 is formed on a front surface of the n-type source region 4 and the $p^+$-type contact region 5. On a surface of a portion of the p-type SiC layer 11 between the n-type region 12 and the n-type source region 4, a gate electrode 7 is formed from the p-type SiC layer 11 to the n-type region 12, via a gate insulating film 6. A drain electrode 9 is formed on a back surface side of the n-type SiC substrate 1 (for example, refer to Japanese Patent Application Laid-Open Publication No. H8-186254).

In the MOSFET of the structure depicted in FIG. 19, when a positive voltage with respect to the source electrode 8 is applied to the drain electrode 9 and a voltage lower than the gate threshold is applied to the gate electrode 7, a pn junction between the p-type base region 10 and the $n^-$-type SiC layer 2, or between the p-type SiC layer 11 and the n-type region 12 is reverse biased and therefore, current does not flow. On the other hand, when voltage equal to or higher than the gate threshold is applied to the gate electrode 7, an inversion layer is formed at the surface of the p-type SiC layer 11 or the p-type base region 10 immediately beneath the gate electrode 7 whereby, switching operation of the MOSFET by the voltage applied to the gate electrode 7 is enabled.

SUMMARY OF THE INVENTION

According to one aspect of the present invention, a semiconductor device includes a silicon carbide substrate of a first conductivity type; a silicon carbide layer of the first conductivity type, formed on a surface of the silicon carbide substrate and having an impurity concentration lower than that of the silicon carbide substrate; a first semiconductor region of a second conductivity type, formed selectively in a surface layer of the silicon carbide layer; a first source region of the first conductivity type, formed selectively in a surface layer of the first semiconductor region; a source electrode electrically connected to a surface of the first source region and the first semiconductor region; a gate electrode formed on a surface of a portion of the first semiconductor region between the silicon carbide layer and the first source region, via a gate insulating film; and a drain electrode formed on a back surface of the silicon carbide substrate. The semiconductor device further includes a second source region of the first conductivity type, formed in the surface layer of the first semiconductor region, farther on an outer side than the first source region, the second source region contacting the first source region and having an impurity concentration higher than that of the first source region; a third semiconductor region of the first conductivity type, formed in a portion of the silicon carbide layer between the first semiconductor regions, the third semiconductor region formed deeper than the first semiconductor regions and to have an impurity concentration higher than that of the silicon carbide layer; and a fourth semiconductor region of the first conductivity type, under the first semiconductor region and of a size smaller than that of the first semiconductor region.

In the semiconductor device, the gate electrode is formed across a top of the third semiconductor region, via the gate insulating film, and the third semiconductor region is divided into a first region contacting the silicon carbide layer and a second region contacting the gate insulating film and having an impurity concentration higher than that of the first region.

In the semiconductor device, the fourth semiconductor region is formed at a portion of the silicon carbide layer under the first semiconductor region, to have a ring-shaped planar shape.

The semiconductor device further includes a second semiconductor region of the second conductivity type, formed in the surface layer of first semiconductor region, farther an inner side than the first source region and having an impurity concentration higher than that of the first semiconductor region. The source electrode is electrically connected to a surface of the first source region and the second semiconductor region, and the fourth semiconductor region is formed under the first semiconductor region to be positioned directly under the second semiconductor region.

According to another aspect of the present invention, a method of manufacturing a semiconductor device, where the semiconductor device includes: a silicon carbide substrate of a first conductivity type; a silicon carbide layer of the first conductivity type, formed on a surface of the silicon carbide substrate and having an impurity concentration lower than that of the silicon carbide substrate; a first semiconductor region of a second conductivity type, formed selectively in a surface layer of the silicon carbide layer; a first source region of the first conductivity type, formed selectively in a surface layer of the first semiconductor region; a source electrode electrically connected to a surface of the first source region and the first semiconductor region; a gate electrode formed on a surface of a portion of the first semiconductor region between the silicon carbide layer and the first source region, via a gate insulating film; and a drain electrode formed on a back surface of the silicon carbide substrate, the method includes forming on the surface of the silicon carbide substrate, the silicon carbide layer to have an impurity concentration lower than that of the silicon carbide substrate; selectively forming the first semiconductor region in the surface layer of the silicon carbide layer; selectively forming the first source region in the surface layer of the first semiconductor region; and forming a second source region of the first conductivity type together with a third semiconductor region of the first conductivity type, the second source region formed in the surface layer of the first semiconductor region, farther on an outer side than the first source region, the second source region contacting the first source region and having an impurity concentration higher than that of the first source region, the third semiconductor region formed in a portion of the silicon carbide layer between the first semiconductor regions, the third semiconductor region formed to be deeper than the first semiconductor regions and have an impurity concentration higher than that of the silicon carbide layer. The method further includes forming under the first semiconductor region at a predetermined timing, a fourth semiconductor region of the first conductivity type and of a size smaller than that of the first semiconductor region.

In the method of manufacturing a semiconductor device, a first region reaching a position deeper than the first semiconductor region and a second region disposed at a position shallower than the first region and having an impurity concentration higher than the first region are formed as the third semiconductor region.

In the method of manufacturing a semiconductor device, the fourth semiconductor region is formed after the first semiconductor region, before the first source region, or after the first source region, before the third semiconductor region.

The method of manufacturing a semiconductor device, further includes selectively forming a second semiconductor region of the second conductivity type in the surface layer of the first semiconductor region, farther on an inner side than the first source region, the second semiconductor region formed after the third semiconductor region and formed to have an impurity concentration higher than that of the first semiconductor region. The fourth semiconductor region is formed after the third semiconductor region, before the second semiconductor region, or after the second semiconductor region.

In the method of manufacturing a semiconductor device, the forming the first source region includes forming on the surface of the first semiconductor region, a first ion implantation mask opened at a portion corresponding to a formation region of the first source region, and performing ion implantation using the first ion implantation mask as a mask to form the first source region, and the forming the fourth semiconductor region includes using the same first ion implantation mask as a mask to form the fourth semiconductor region.

In the method of manufacturing a semiconductor device, the forming the second semiconductor region includes forming on the surface of the first semiconductor region, a second ion implantation mask opened at a portion corresponding to a formation region of the second semiconductor region, and performing ion implantation using the second ion implantation mask as a mask to form the second semiconductor region, and the forming the fourth semiconductor region includes using the same second ion implantation mask as a mask to form the fourth semiconductor region.

In the method of manufacturing a semiconductor device, the forming the first source region includes forming on the surface of the first semiconductor region, a first ion implantation mask opened at a portion corresponding to a formation region of the first source region, and performing ion implantation using the first ion implantation mask as a mask to form the first source region. The forming the third semiconductor region includes increasing a width of an opening of the first implantation mask so as to selectively expose a portion of the first semiconductor region, farther on the outer side than the first source region and selectively removing the first ion implantation mask so as to expose a portion of the silicon carbide layer between the first semiconductor regions, and forming the second source region, the third semiconductor region by performing ion implantation using a remaining portion of the first ion implantation mask as a mask ion implantation.

In the method of manufacturing a semiconductor device, an impurity used in forming the first source region, the second source region, and the third semiconductor region is nitrogen, phosphorous having a large projected range.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 8 is a diagram of avalanche current flow in the first embodiment of the semiconductor device of the present invention;

FIG. 9 is a plan diagram of the junction portion of the p-type base region with the n-type region and the n-type silicon carbide layer of the MOSFET in a second embodiment of the semiconductor device;

FIGS. 10 and 11 are cross-sectional views of the MOSFET in the second embodiment of the semiconductor device of the present invention;

DETAILED DESCRIPTION OF THE INVENTION

Figure 1:
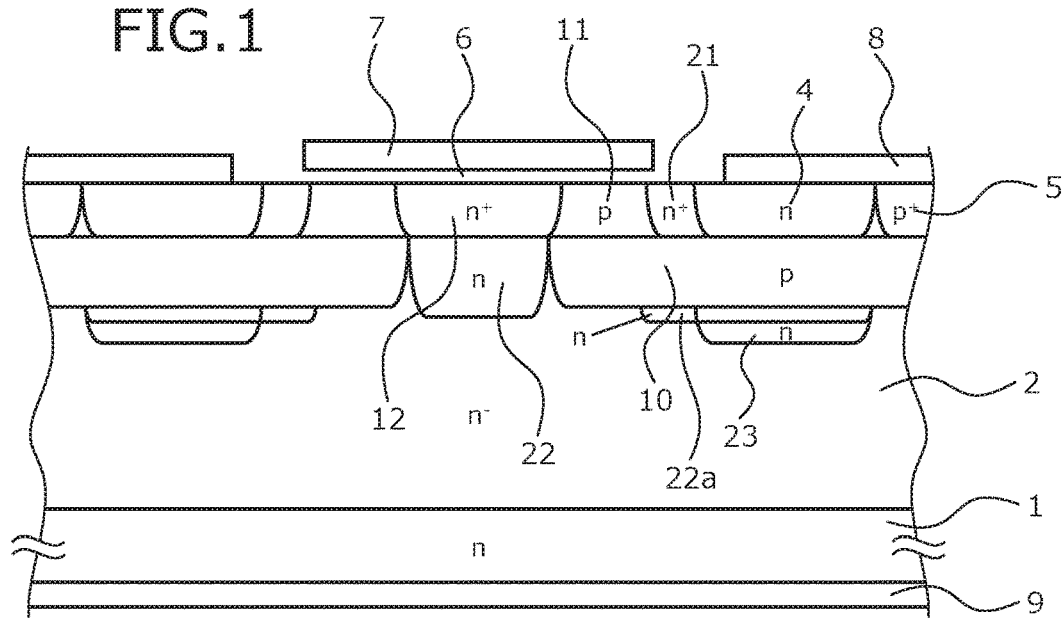
FIG. 1 is a cross-sectional view of a MOSFET in a first embodiment of a semiconductor device of the present invention.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described. Further, in the present description, when Miller indices are described, "−" means a bar added to an index immediately after the "−", and a negative index is expressed by prefixing "−" to the index.

FIG. 1 is a cross-sectional view of a MOSFET in a first embodiment of the semiconductor device of the present invention. In the present embodiments, although a first conductivity type is assumed to be an n-type and a second conductivity type is assumed to be a p-type, these may be reversed.

An n⁻-type SiC layer 2 is formed on a front surface side of an n-type SiC substrate 1, and in a surface layer of the n⁻-type SiC layer 2, a p-type base region (first semiconductor region of the second conductivity type) 10 is formed in plural. Herein, a stacked body formed by the n⁻-type SiC layer 2 and the p-type SiC layer 11 (described hereinafter) sequentially stacked on the n-type SiC substrate 1 is assumed as a SiC body. An n-type region (third semiconductor region of the first conductivity type) 22 is formed between the p-type base regions 10. A depth of the n-type region 22 from the n⁻-type SiC layer 2 surface (surface of the n⁻-type SiC layer 2, on the side opposite the n-type SiC substrate 1 side) is deeper than a depth of the p-type base region 10 from the n⁻-type SiC layer 2 surface. Under the p-type base region 10 (body back surface side), a second n-type region (fourth semiconductor region of the first conductivity type) 23 is formed. When the n-type region 22 is formed, an n-type region 22a of the same impurity concentration as the n-type region 22 may be formed.

The p-type SiC layer 11 is formed in the surface of the n⁻-type SiC layer 2. The impurity concentration of the p-type SiC layer 11 is lower than that of the p-type base region 10. In a portion of the p-type SiC layer 11 on the n-type region 22, an n⁺-type region 12 is formed from the front surface toward the back surface so as to reach the n-type region 22. Further, in the p-type SiC layer 11, a second n⁺-type source region (second source region of the first conductivity type) 21, a n-type source region (first source region of the first conductivity type) 4, and a p⁺-type contact region (second semiconductor region of the second conductivity type) 5 are selectively formed. The n-type source region 4 contacts the p⁺-type contact region 5 and is disposed farther on the n⁺-type region 12 side than the p⁺-type contact region 5. The second n⁺-type source region 21 contacts the n-type source region 4 and is disposed farther on the n⁺-type region 12 side than the n-type source region 4. The second n⁺-type source region 21 has a higher impurity concentration than that of the n-type source region 4. The n-type source region 4, the second n⁺-type source region 21, and the p⁺-type contact region 5, in a direction of depth, penetrate the p-type SiC layer 11 and reach the p-type base region 10.

On the front surface of the n-type source region 4 and the p⁺-type contact region 5, a source electrode 8 is formed. On a surface of the p-type SiC layer 11 between the n⁺-type region 12 and the second n⁺-type source region 21, a gate electrode 7 is formed via a gate insulating film 6. The gate electrode 7 may extend on the n⁺-type region 12, via the gate insulating film 6. The gate electrode 7 portion (not depicted) connecting the cell with another cell is connected to the p-type SiC layer 11, without forming the n⁺-type region 12. A drain electrode 9 is formed on the back surface of the n-type SiC substrate 1.

Figure 2:
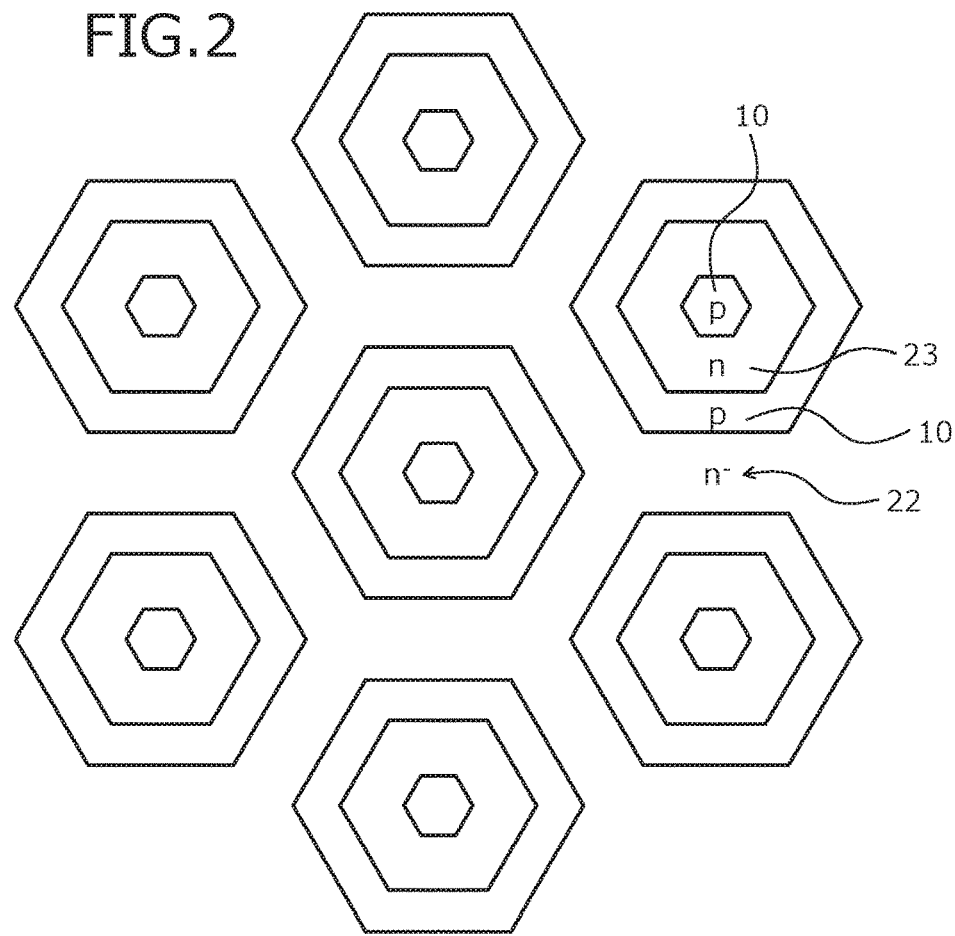
FIG. 2 is a plan diagram of a junction portion of a p-type base region with an n-type region and an n-type silicon carbide layer of the MOSFET in the first embodiment of the semiconductor device.

FIG. 2 is a plan diagram of a junction portion of the p-type base region with the n-type region and the n-type silicon carbide layer of the MOSFET in the first embodiment of the semiconductor device. FIG. 2 is a plan diagram of a junction face of the p-type base region 10 with the second n-type region 23 and the n⁻-type SiC layer 2 depicted in FIG. 1. As depicted in the element diagram of FIG. 2, the second n-type region 23 is disposed in a ring-shape at a portion under the p-type base region 10 (body back surface side). In the example depicted in FIG. 2, although the second n-type region 23 is depicted as a hexagonal cell centered about the p⁺-type contact region 5, the shape is not limited to a polygonal cell and may be a circular cell.

Operation of the MOSFET depicted in FIGS. 1 and 2 is the same as that of a conventional MOSFET. In other words, voltage equal to or higher than the threshold voltage is applied to the gate electrode 7 and by the formation of an inversion layer on the surface of the p-type SiC layer 11 or the p-type base region 10, the MOSFET is turned on.

FIGS. 3, 4, 5, 6, and 7 are diagrams depicting manufacturing processes in the first embodiment of the semiconductor device of the present invention. The MOSFET in the first embodiment is manufactured by the process sequence (a) depicted in FIG. 3 to (e) depicted in FIG. 7.

Figure 3:
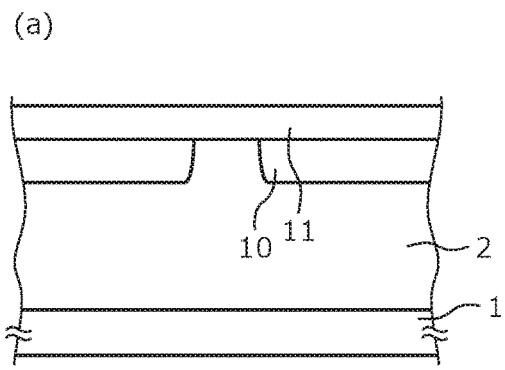
FIGS. 3, 4, 5, 6, and 7 are diagrams depicting manufacturing processes in the first embodiment of the semiconductor device of the present invention.

(a) As depicted in FIG. 3, for example, the n⁻-type SiC layer 2 is deposited (formed) on the front surface of the n-type SiC substrate 1 by epitaxial growth. The p-type base region 10 is selectively formed in the surface layer of the n⁻-type SiC layer 2. The p-type base region 10, for example, is formed, by aluminum (Al) ion implantation, at a depth of about 0.5 μm from the n⁻-type SiC layer 2 surface and to have an impurity concentration of about $3.0 \times 10^{18}$ cm⁻³. Thereafter, for example, on the entire surface of the n⁻-type SiC layer 2, for example, the p-type SiC layer 11 is formed by epitaxial growth, to a depth of about 0.5 μm and to have an impurity concentration of about $5.0 \times 10^{15}$ cm⁻³. The n⁻-type SiC layer 2, for example, is formed to have an impurity concentration of about $1.0 \times 10^{16}$ cm⁻³ and a thickness of about 10 μm in the case of a 1200 V MOSFET.

Figure 4:
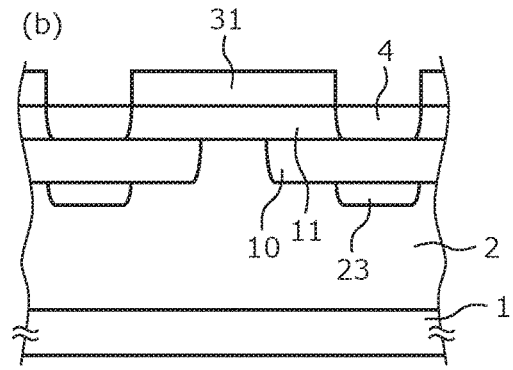

(b) As depicted in FIG. 4, an oxide film 31 is formed on the surface of the p-type SiC layer 11 and a portion of the oxide film 31 corresponding to a formation region of the n-type source region 4 is removed. The remaining portion of the oxide film 31 is used as a mask to selectively form the n-type source region 4 in the p-type SiC layer 11 by ion implantation of an n-type impurity such as phosphorus (P). The n-type source region 4, for example, is formed at a depth of about 0.5 μm and to have an impurity concentration of about $1.0 \times 10^{20}$ cm⁻³ or higher. The second n-type region 23 is formed by ion implantation of an n-type impurity by using the remaining portion of the oxide film 31 remaining of the opening width that is the same as when the n-type source region 4 is formed.

The second n-type region 23, for example, is formed at a predetermined depth (i.e., under the p-type base region 10) by implanting an impurity concentration about 1.2 to 1.5 times that of the n⁻-type SiC layer 2 at a depth of about 1.5 to 1.0 μm by a high-implantation energy of 600 keV or higher. The second n-type region 23 is formed having a smaller size (area) than that of the p-type base region 10 (a horizontal end of the second n-type region 23 is positioned farther on an inner side than a corner portion of the p-type base region 10) and as depicted in FIG. 2, is formed to have a ring-shaped planar shape. Here, although the n-type impurity is also ion implanted in the p-type base region 10, since the impurity concentration of the p-type base region 10, for example, is about $3.0 \times 10^{18}$ cm⁻³, which is a high impurity concentration relative to that of the second n-type region 23, the p-type base region 10 is not inverted to an n-type by the formation of the second n-type region 23. The sequence in which the n-type source region 4 and the second n-type region 23 are formed is interchangeable.

Figure 5:
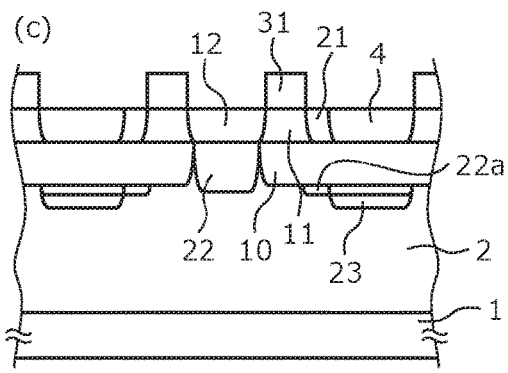

(c) As depicted in FIG. 5, portions of the oxide film 31 corresponding to formation regions of the second $n^+$-type source region 21 and the $n^+$-type region 12 are removed. The remaining portion of the oxide film 31 is used as a mask to selectively form the n-type region 22 in the surface layer of the $n^-$-type SiC layer 2 by ion implantation of an n-type impurity such as nitrogen (N). The n-type region 22, for example, is formed at a depth of about 1.2 μm from the surface of the $n^-$-type SiC layer 2 and to have an impurity concentration 1.2 to 1.5 times that of the $n^-$-type SiC layer 2. Here, although the n-type impurity is also ion implanted in the p-type base region 10, since the impurity concentration of the p-type base region 10 is, for example, about $3.0 \times 10^{18}$ cm$^{-3}$, which is a high impurity concentration relative to that of the n-type region 22, the p-type base region 10 is not inverted to an n-type by the formation of the n-type region 22. Further, at this time, the n-type region 22a of the same impurity concentration as the n-type region 22 may be formed under the p-type base region 10.

The remaining portion of the oxide film 31 remaining of the opening width that is the same as when the n-type region 22 is formed is used as is as a mask to form the second $n^+$-type source region 21 and the $n^+$-type region 12 by ion implantation of an n-type impurity. The second $n^+$-type source region 21 and the $n^+$-type region 12, for example, are formed at a depth of about 0.5 μm and to have an impurity concentration of about $4.0 \times 10^{16}$ cm$^{-3}$. The oxide film 31 is removed completely. The sequence in which the n-type region 22, and the second $n^+$-type source region 21 and the $n^+$-type region 12 are formed is interchangeable.

Figure 6:
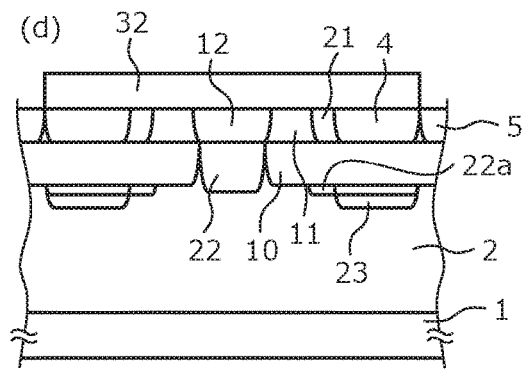

(d) As depicted in FIG. 6, an oxide film 32 is formed on the surface of the p-type SiC layer 11 and a portion of the oxide film 32 corresponding to the formation region of the $p^+$-type contact region 5 is removed. The remaining portion of the oxide film 32 is used as a mask to form the $p^+$-type contact region 5 by, for example, ion implantation of a p-type impurity such as Al. The $p^+$-type contact region 5, for example, is formed at a depth of about 0.5 μm and to have an impurity concentration of about $1.0 \times 10^{20}$ cm$^{-3}$. The oxide film 32 is removed completely.

Figure 7:
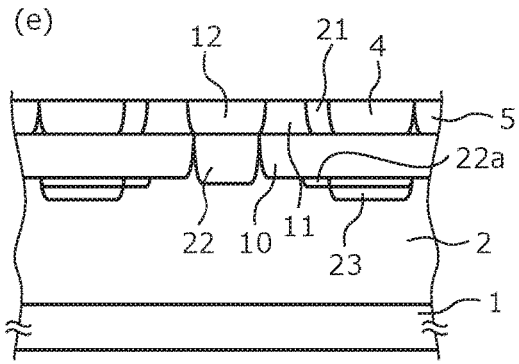

(e) As depicted in FIG. 7, activation annealing is performed at a temperature of 1600 degrees C. or higher, and activation and removal of ion implantation damage of each layer is performed.

(f) By an ordinary method, surface structures and the back surface electrode (drain electrode) 9 are formed to obtain the semiconductor device in FIG. 1. The surface structures include the gate insulating film 6, the gate electrode 7, an interlayer insulating film (not depicted), the source electrode 8, an electrode pad, a passivation protection file (not depicted), etc.

The thickness of the oxide films 31, 32 used as masks in ion implantation, for example, has to be about 1.5 μm or more, and an impurity of nitrogen (N) or phosphorus (P) having a large projected range may be used in the ion implantation for forming the n-type regions. By the processes described above, a vertical MOSFET of the first embodiment is formed.

Since the three regions: the n-type region 22, the second $n^+$-type source region 21, and the $n^+$-type region 12 may be formed by a single photolithographic process in this manner, the number of processes may be reduced drastically. The MOSFET formed by the processes described has the following operational advantages (1) to (5).

(1) The n-type region 22 having a higher impurity concentration than the $n^-$-type SiC layer 2 is formed between the p-type base regions 10, whereby JFET resistance may be reduced, making on-resistance smaller.

(2) The n-type region 22 and the second $n^+$-type source region 21 are concurrently formed using a single mask (the oxide film 31), whereby the problem of channel length variation consequent to alignment variation does not occur, enabling variation of characteristics such as thresholds, on-resistance, etc. to be reduced and stable characteristics to be obtained.

This concurrent formation is any of:
1. Concurrent formation of the $n^+$-type region 12 and the second $n^+$-type source region 21
2. Formation of the n-type region 22 and the second $n^+$-type source region 21 using the same oxide film 31 as a mask
3. Formation of the n-type region 22, the $n^+$-type region 12, and the second $n^+$-type source region 21 using the same oxide film 31 as a mask (3) At a pn junction portion of the second n-type region 23 formed under the p-type base region 10, avalanche may be caused, enabling improved reliability and resistance to dielectric breakdown of the gate insulating film 6.

(4) The second n-type region 23 is formed to be smaller than the p-type base region 10 (the horizontal end of the second n-type region 23 is positioned farther on the inner side than the corner portion of the p-type base region 10) and formed to have a ring-shaped planar shape, whereby avalanche may be caused at a pn junction portion of a terminal portion of the second n-type region 23.

FIG. 8 is a diagram of avalanche current flow in the first embodiment of the semiconductor device of the present invention. The second n-type region 23 is formed to have a size (area) smaller than that of the p-type base region 10 (the horizontal end of the second n-type region 23 is positioned farther on the inner side than the corner portion of the p-type base region 10) whereby, as depicted in FIG. 8, a path of avalanche current flowing from the p-type base region 10 toward the source electrode 8 is split into a path from one end of the second n-type region 23, passing through a portion of the p-type base region 10 under the n-type source region 4, toward the source electrode 8, and a path from the other end of the second n-type region 23, toward the source electrode 8 and not passing under the n-type source region 4. Therefore, the avalanche current flowing through the portion of the p-type base region 10 under the n-type source region 4 may be reduced. As a result, operation of a parasitic npn bipolar transistor formed by the $n^-$-type SiC layer 2, the p-type base region 10, and the n-type source region 4 may be suppressed, whereby the resistance to breakdown of the element may be improved.

(5) The n-type source region is formed by two layers (the n-type source region 4, second $n^+$-type source region 21) of differing impurity concentrations, whereby saturation current is reduced and current during short circuit may be suppressed, improving resistance to breakdown of the element.

FIG. 9 is a plan diagram of a junction portion of the p-type base region with the n-type region and the n-type silicon carbide layer of the MOSFET in the second embodiment of the semiconductor device. FIGS. 10 and 11 are cross-sectional views of the MOSFET in the second embodiment of the semiconductor device of the present invention. FIG.

10 is a cross-sectional view along cutting line A-A' in FIG. 9 and FIG. 11 is a cross-sectional view along cutting line B-B' in FIG. 9.

The basic structure of the second embodiment of the present invention is the same as that of the first embodiment described above. The second embodiment differs from the first embodiment in that, as depicted in FIG. 9, the planar shape of the p-type base region 10 is formed in a striped shape and the second n-type region 23 is formed to have a ladder-like planar shape under the p-type base region 1. Thus, the second n-type regions 23 under adjacent p-type base regions 10 that are at constant intervals are connected, whereby avalanche occurs easily near the p$^+$-type contact region 5. As a result, avalanche current flowing through the portion of the p-type base region 10 under the n-type source region 4 may be suppressed, suppressing operation of a parasitic npn transistor and improving resistance to breakdown of the element.

Figure 12:
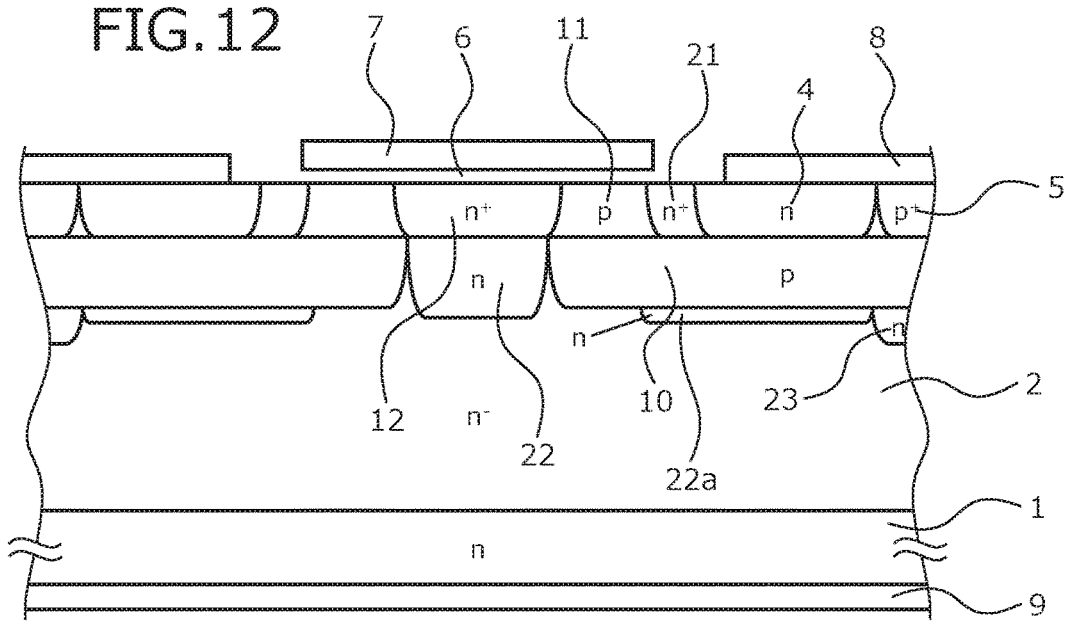
FIG. 12 is a cross-sectional view of the MOSFET in a third embodiment of the semiconductor device of the present invention.
Figure 13:
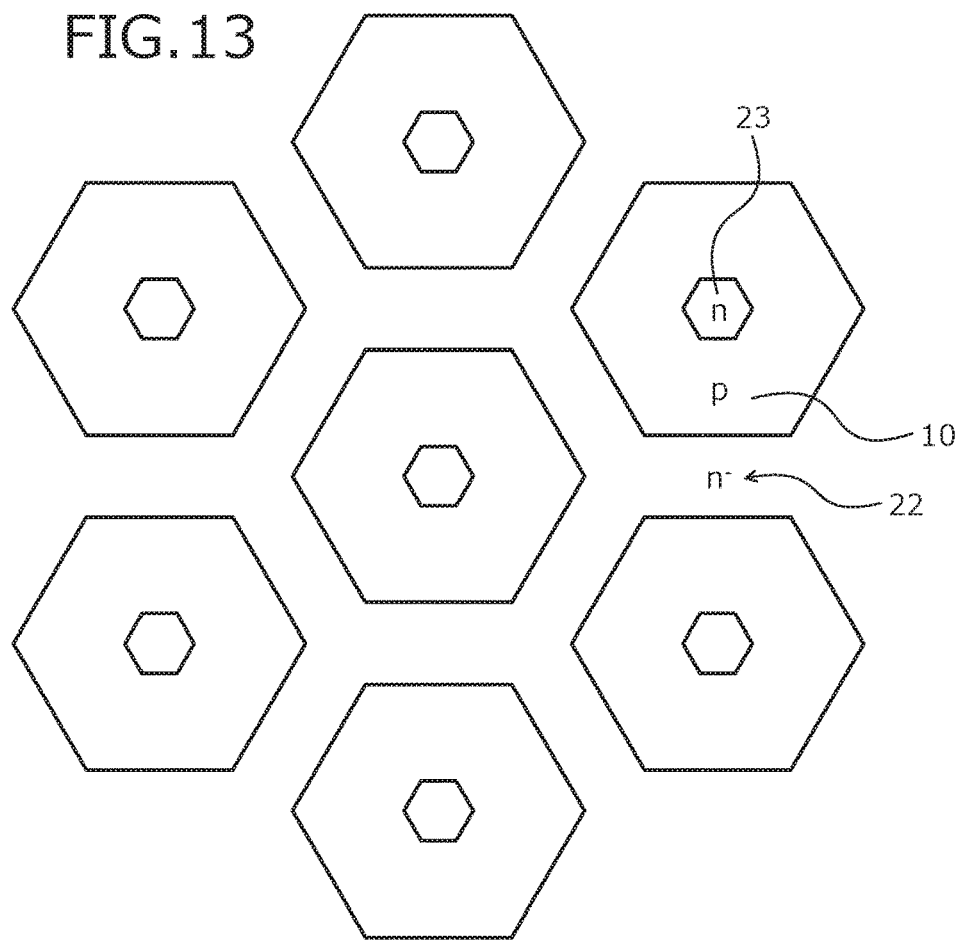
FIG. 13 is a plan diagram of the junction portion of the p-type base region with the n-type region and the n-type silicon carbide layer of the MOSFET in the third embodiment of the semiconductor device.

FIG. 12 is a cross-sectional view of the MOSFET in a third embodiment of the semiconductor device of the present invention. FIG. 13 is a plan diagram of the junction portion of the p-type base region with the n-type region and the n-type silicon carbide layer of the MOSFET in the third embodiment of the semiconductor device.

The third embodiment differs from the first embodiment in that in the first and second embodiments, the second n-type region 23 formed under the p-type base region 10 is formed under the p$^+$-type contact region 5. As depicted by the element configuration in FIG. 13, at the junction portion of the p-type base region 10 with the n$^-$-type SiC layer 2 and the second n-type region 23, the second n-type region 23 is formed as a center portion of the p-type base region 10. Although the example depicted in FIG. 13 depicts a planar shape of a hexagonal cell centered about the p$^+$-type contact region 5, the planar shape of the p$^+$-type contact region 5 may be formed as a polygonal cell or a circular cell.

FIGS. 14, 15, 16, 17, and 18 are diagrams depicting manufacturing processes in the third embodiment of the semiconductor device of the present invention. The MOSFET in the third embodiment is manufactured by the process sequence (a) depicted in FIG. 14 to (e) depicted in FIG. 18.

Figure 14:
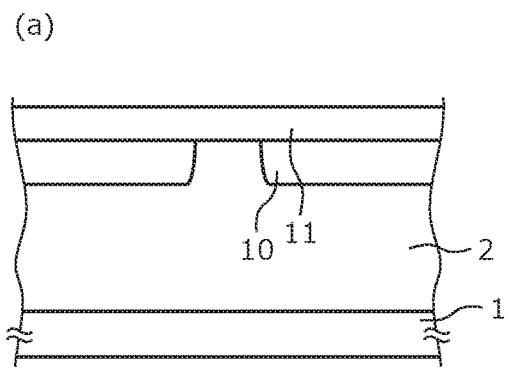
FIGS. 14, 15, 16, 17, and 18 are diagrams depicting manufacturing processes in the third embodiment of the semiconductor device of the present invention.

(a) As depicted in FIG. 14, for example, the n$^-$-type SiC layer 2 is deposited (formed) on the front surface of the n-type SiC substrate 1 by epitaxial growth. The p-type base region 10 is formed in the surface layer of the n$^-$-type SiC layer 2. The p-type base region 10, for example, is formed by Al ion implantation to a depth of about 0.5 μm from the surface of the n$^-$-type SiC layer 2 and to have an impurity concentration of $3.0 \times 10^{18}$ cm$^{-3}$. Thereafter, for example, on the entire surface of the n$^-$-type SiC layer 2, the p-type SiC layer 11 is formed by epitaxial growth, to a depth of 0.5 μm and to have an impurity concentration of $5.0 \times 10^{15}$ cm$^{-3}$. The n$^-$-type SiC layer 2, for example, is formed to have an impurity concentration of $1.0 \times 10^{16}$ cm$^{-3}$ and a thickness of about 10 μm in the case of a 1200 V MOSFET.

Figure 15:
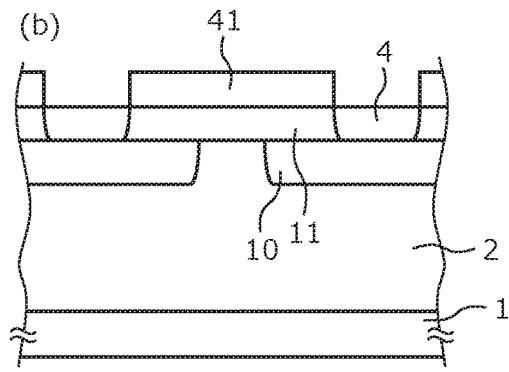

(b) As depicted in FIG. 15, an oxide film 41 is formed on the surface of the p-type SiC layer 11 and a portion of the oxide film 41 corresponding to a formation region of the n-type source region 4 is removed. The remaining portion of the oxide film 41 is used as a mask to selectively form the n-type source region 4 in the p-type SiC layer 11 by ion implantation of an n-type impurity. The n-type source region 4, for example, is formed at a depth of about 0.5 μm and to have an impurity concentration of about $1.0 \times 10^{20}$ cm$^{-3}$ or higher.

Figure 16:
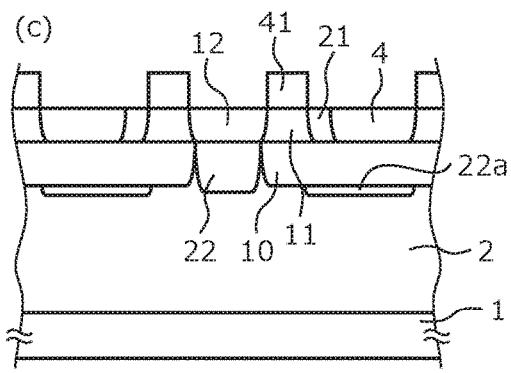

(c) As depicted in FIG. 16, portions of the oxide film 41 corresponding to formation regions of the second n$^+$-type source region 21 and the n$^+$-type region 12 are removed. The remaining portion of the oxide film 41 is used as a mask to selectively form the n-type region 22 in the surface layer of the n$^-$-type SiC layer 2 by ion implantation of an n-type impurity. The n-type region 22, for example, is formed at a depth of about 1.2 μm and to have an impurity concentration about 1.2 to 1.5 times that of the n$^-$-type SiC layer 2. Here, although the n-type impurity is also ion implanted in the p-type base region 10, since the impurity concentration of the p-type base region 10 is, for example, about $3.0 \times 10^{18}$ cm$^{-3}$, which is a high impurity concentration relative to that of the n-type region 22, the p-type base region 10 is not inverted to an n-type by the formation of the n-type region 22. Further, at this time, the n-type region 22a of the same impurity concentration as the n-type region 22 may be formed under the p-type base region 10.

The remaining portion of the oxide film 41 remaining of the opening width that is the same as when the n-type region 22 is formed is used as is as a mask to form the second n$^+$-type source region 21 and the n$^+$-type region 12 by ion implantation of an n-type impurity. The second n$^+$-type source region 21 and the n$^+$-type region 12, for example, are formed at a depth of about 0.5 μm and to have an impurity concentration of about $4.0 \times 10^{16}$ cm$^{-3}$. The sequence in which the n-type region 22, and the second n$^+$-type source region 21 and the n$^+$-type region 12 are formed is interchangeable. The oxide film 41 is removed completely.

Figure 17:
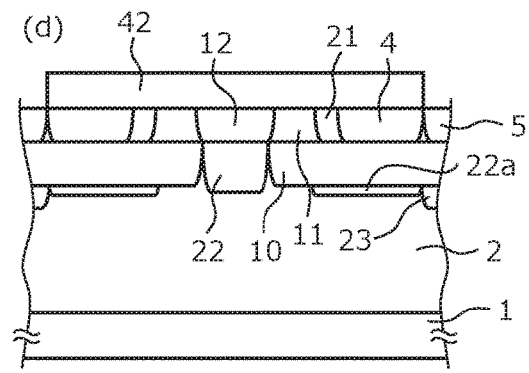

(d) As depicted in FIG. 17, an oxide film 42 is formed on the surface of the p-type SiC layer 11 and a portion of the oxide film 42 corresponding to a formation region of the p$^+$-type contact region 5 is removed. The remaining portion of the oxide film 42 is used as a mask to form the p$^+$-type contact region 5 by, for example, ion implantation of a p-type impurity such as Al. The p$^+$-type contact region 5, for example, is formed at a depth of about 0.5 μm and to have an impurity concentration of about $1.0 \times 10^{20}$ cm$^{-3}$. The oxide film 42 remaining of an opening width that is the same as when the p$^+$-type contact region 5 is formed is used as a mask to form the second n-type region 23 by ion implantation of a p-type impurity. The second n-type region 23, for example, is formed at a predetermined depth by implanting an impurity concentration about 1.2 to 1.5 times that of the n$^-$-type SiC layer 2 at a depth of about 1.5 to 1.0 μm by a high implantation energy of 600 keV or higher.

In the example depicted in FIG. 17, the second n-type region 23 is formed under the p-type base region 10 to be positioned directly under the p$^+$-type contact region 5. Here, the impurity concentration of the p-type base region 10, for example, is about $3.0 \times 10^{18}$ cm$^{-3}$, which is a relatively high impurity concentration compared to that of the second n-type region 23 and therefore, the p-type base region 10 is not inverted to an n-type by the formation of the second n-type region 23. The sequence in which the p$^+$-type contact region 5 and the second n-type region 23 are formed is interchangeable.

Figure 18:
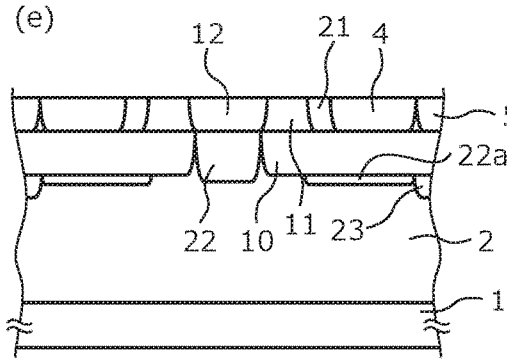
Figure 19:
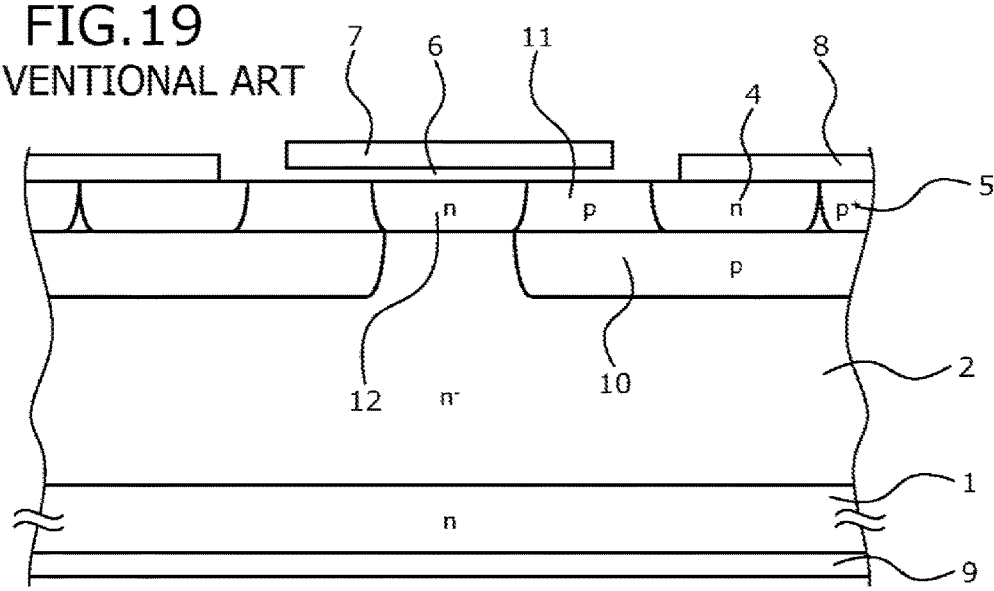
FIG. 19 is a cross-sectional view of a conventional re-channel MOSFET formed using a silicon carbide substrate.

(e) As depicted in FIG. 18, activation annealing is performed at a temperature of 1600 degrees C. or higher, and activation and removal of ion implantation damage of each layer is performed.

(f) Similar to the first embodiment, the surface structures and the back surface electrode (drain electrode) 9 are formed, obtaining the semiconductor device depicted in FIG. 12.

In the third embodiment, similar to the first embodiment, the thickness of the oxide films 41, 42 used as a mask in the ion implantation, for example, has to be about 1.5 μm or more, and an impurity of nitrogen (N) or phosphorus (P)

having a large projected range may be used in the ion implantation for forming the n-type regions. By the processes described above, a vertical MOSFET of the third embodiment exhibiting the same characteristics as the first embodiment is formed.

According to the embodiments described above, the n-type region and the second n-type source region formed on the surface are concurrently formed, thereby eliminating the problem of alignment variation, enabling control of the threshold and stable characteristics to be obtained as well as enabling reduction of the on-resistance by decreased JFET resistance by the n-type region formed between the p-type base regions.

Further, since the n-type region is formed under the p-type base region, when a high voltage is applied to the drain electrode, avalanche occurs at the pn junction portion of the p-type base region and the n-type region formed under the p-type base region. As a result, application of a large electric field on the gate insulating film does not occur, improving the resistance to breakdown of the gate insulating film and improving the reliability of the gate insulating film. Further, the n-type region is formed to be smaller than the p-type base region, whereby the location where avalanche occurs is at the pn junction portion, and the avalanche current of the p-type base region, flowing through the portion under the n-type source region is reduced, enabling operation of the parasitic npn transistor to be suppressed, whereby the resistance to breakdown of the element is improved. Furthermore, the n-type source region is formed by two layers of differing impurity concentrations, whereby saturation current of the element may be suppressed together with current during short circuit to improve the resistance to breakdown.

Three regions: the n-type region 22, the second n$^+$-type source region 21, and the n$^+$-type region 12 are formed concurrently by a single photolithographic process, whereby the element may be formed without an accompanying increase of formation processes and with the formed element, the problem of alignment variation is resolved, enabling stable characteristics to be obtained together with improved reliability and resistance to breakdown.

On the contrary, with the conventional MOSFET structure described above, the n-type region 12 and the n-type source region 4 are independently formed, the processing precision is poor, and characteristics variation increases. Further, when the n-type region 12 of a higher impurity concentration than the n$^-$-type SiC layer 2 is disposed between the p-type base regions 10 to improve the on-resistance, the number of processes increases and as described, the processing precision becomes poor and characteristics variation increases. Moreover, when a high voltage is applied to the drain electrode 9, at the pn junction portion formed by the p-type base region 10 and the n$^-$-type SiC layer 2, particularly at a terminal portion of the p-type base region 10, avalanche tends to occur easily.

Figure 20:
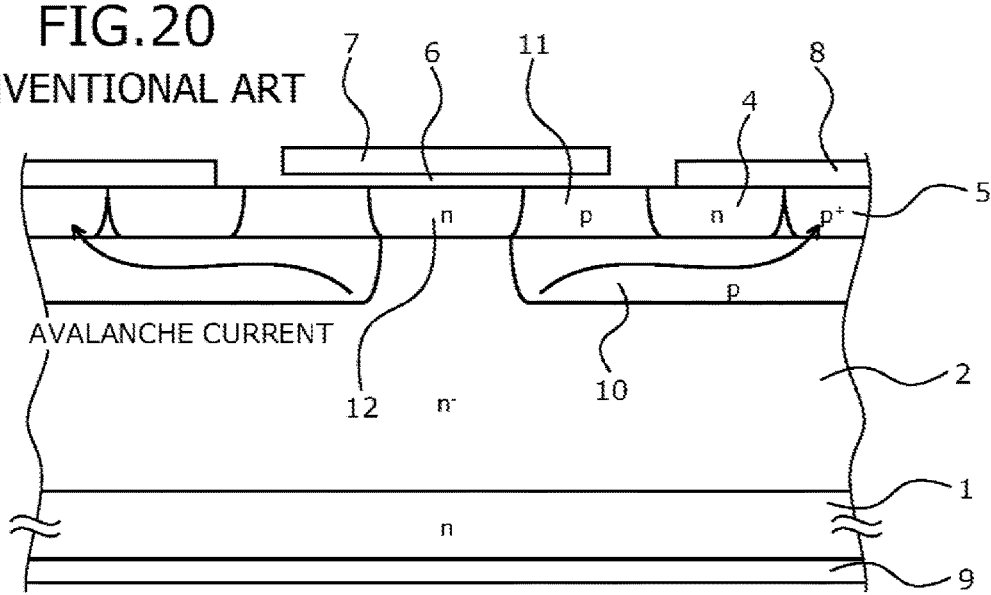
FIG. 20 is a cross-sectional view depicting a path of avalanche current of a conventional n-channel MOSFET formed using a silicon carbide substrate.

FIG. 20 is a cross-sectional view depicting a path of avalanche current of a conventional n-channel MOSFET formed using a silicon carbide substrate. As depicted by arrows in FIG. 20, avalanche current flows along a path from the corner portion of the p-type base region 10, through a portion of the p-type base region 10 under the n-type source region 4, toward the source electrode 8, and consequent to this avalanche current, a parasitic npn bipolar transistor formed by the n$^-$-type SiC layer 2, the p-type base region 10, and the n-type source region 4 may operate, decreasing the resistance to breakdown.

According to the configuration described in the embodiments, the third semiconductor region of the first conductivity type and the first source region of the first conductivity type formed in the surface are formed concurrently, eliminating the problem of alignment variation, enabling control of the threshold and stable characteristics to be obtained as well as enabling reduction of the on-resistance by decreased JFET resistance by the region of first conductivity type formed between the first semiconductor regions of the second conductivity type. Further, since the fourth semiconductor region of the first conductivity type is formed under the first semiconductor region of the second conductivity type, when a high voltage is applied to the drain electrode, avalanche occurs at a pn junction portion of the first semiconductor region of the second conductivity type and the third semiconductor region of first conductivity type formed under the first semiconductor region of the second conductivity type. As a result, application of a large electric field on the gate insulating film does not occur, improving the resistance to breakdown of the gate insulating film and improving the reliability of the gate insulating film. Further, the third semiconductor region of the first conductivity type is formed to be smaller than the first semiconductor region of the second conductivity type, whereby the location where avalanche occurs is at the pn junction portion, and the avalanche current of the first semiconductor region of the second conductivity type, flowing through the portion under the first source region of the first conductivity type is reduced, enabling operation of the parasitic npn transistor to be suppressed, whereby the resistance to breakdown of the element is improved. Furthermore, the first source region of the first conductivity type is formed by two layers of differing impurity concentrations, whereby saturation current of the element may be suppressed together with current during short circuit to improve the resistance to breakdown. The first source region of the first conductivity type and third semiconductor region are formed concurrently by a single photolithographic process, whereby the element may be formed without an accompanying increase of formation processes and with the formed element, the problem of alignment variation is resolved, enabling stable characteristics to be obtained together with improved reliability and resistance to breakdown.

According to the present invention, precision of threshold voltage Vth and low on-resistance are enhanced to increase quality and improve dielectric breakdown resistance of the gate insulating film and resistance to breakdown.

In the description above, various modifications of the invention are possible and in the described embodiments, for example, dimensions, impurity concentrations, etc. of components may be set according to required specifications. Further, in the embodiments although a case where a base region of a structure in which a p-type base region and a p-type silicon carbide layer of differing impurity concentrations are stacked in the depth direction is described as an example, without limitation hereto, the base region may be a single p-type region having a uniform impurity concentration in the depth direction.

As described, the semiconductor device and the method of manufacturing a semiconductor device according to the present invention are useful for high-voltage semiconductors used in used in power converting equipment, and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, including a silicon carbide substrate of a first conductivity type; a silicon carbide layer of the first conductivity type, formed on a surface of the silicon carbide substrate and having an impurity concentration lower than that of the silicon carbide substrate; a first semiconductor region of a second conductivity type, formed selectively in a surface layer of the silicon carbide layer; a first source region of the first conductivity type, formed selectively in a surface layer of the first semiconductor region; a source electrode electrically connected to a surface of the first source region and the first semiconductor region; a gate electrode formed on a surface of a portion of the first semiconductor region between the silicon carbide layer and the first source region, via a gate insulating film; and a drain electrode formed on a back surface of the silicon carbide substrate, the method comprising:

forming on the surface of the silicon carbide substrate, the silicon carbide layer to have an impurity concentration lower than that of the silicon carbide substrate;

selectively forming, after forming the silicon carbide layer, the first semiconductor region in the surface layer of the silicon carbide layer;

selectively forming, after selectively forming the first semiconductor region, the first source region in the surface layer of the first semiconductor region; and forming, after selectively forming the first source region, a second source region of the first conductivity type together with a third semiconductor region of the first conductivity type, the second source region being formed in the surface layer of the first semiconductor region, on a side of the first source region within the first semiconductor region, the second source region being formed to contact the first source region and to have an impurity concentration higher than that of the first source region, the third semiconductor region being formed in a portion of the silicon carbide layer between the first semiconductor regions, the third semiconductor region being formed to be deeper than the first semiconductor regions and having an impurity concentration higher than that of the silicon carbide layer, wherein the method further comprises forming under the first semiconductor region at a predetermined timing, a fourth semiconductor region of the first conductivity type and of a size smaller than that of the first semiconductor region.

2. The method of manufacturing a semiconductor device, according to claim 1, wherein
a first region reaching a position deeper than the first semiconductor region and a second region disposed at a position shallower than the first region and having an impurity concentration higher than the first region are formed as the third semiconductor region.

3. The method of manufacturing a semiconductor device according to claim 1, wherein
the fourth semiconductor region is formed after the first semiconductor region, before the first source region, or after the first source region, before the third semiconductor region.

4. The method of manufacturing a semiconductor device according to claim 1, further comprising
selectively forming a second semiconductor region of the second conductivity type in the surface layer of the first semiconductor region, on a side of the first source region, the second semiconductor region formed after the third semiconductor region and formed to have an impurity concentration higher than that of the first semiconductor region, wherein
the fourth semiconductor region is formed after the third semiconductor region, before the second semiconductor region, or after the second semiconductor region.

5. The method of manufacturing a semiconductor device according to claim 3, wherein
the forming the first source region includes forming on the surface of the first semiconductor region, a first ion implantation mask opened at a portion corresponding to a formation region of the first source region, and performing ion implantation using the first ion implantation mask as a mask to form the first source region, and
the forming the fourth semiconductor region includes using the same first ion implantation mask as a mask to form the fourth semiconductor region.

6. The method of manufacturing a semiconductor device according to claim 4, wherein
the forming the second semiconductor region includes forming on the surface of the first semiconductor region, a second ion implantation mask opened at a portion corresponding to a formation region of the second semiconductor region, and performing ion implantation using the second ion implantation mask as a mask to form the second semiconductor region, and
the forming the fourth semiconductor region includes using the same second ion implantation mask as a mask to form the fourth semiconductor region.

7. The method of manufacturing a semiconductor device according to claim 1, wherein
the forming the first source region includes forming on the surface of the first semiconductor region, a first ion implantation mask opened at a portion corresponding to a formation region of the first source region, and performing ion implantation using the first ion implantation mask as a mask to form the first source region,
the forming the third semiconductor region includes increasing a width of an opening of the first implantation mask so as to selectively expose a portion of the first semiconductor region, on a side of the first source region and selectively removing the first ion implantation mask so as to expose a portion of the silicon carbide layer between the first semiconductor regions, and forming the second source region, the third semiconductor region by performing ion implantation using a remaining portion of the first ion implantation mask as a mask ion implantation.

8. The method of manufacturing a semiconductor device according to claim 5, wherein
an impurity used in forming the first source region, the second source region, and the third semiconductor region is nitrogen, phosphorous having a large projected range.

* * * * *